(12) United States Patent
Sheu et al.

(10) Patent No.: US 6,455,943 B1
(45) Date of Patent: Sep. 24, 2002

(54) BONDING PAD STRUCTURE OF SEMICONDUCTOR DEVICE HAVING IMPROVED BONDABILITY

(75) Inventors: Shing-Ren Sheu, Tao-Yuan; Hermen Liu, Hsin-Chu, both of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/840,720

(22) Filed: Apr. 24, 2001

(51) Int. Cl.[7] .................... H01L 23/485; H01L 23/48
(52) U.S. Cl. .................... 257/786; 257/758; 257/773
(58) Field of Search .................... 257/758, 773, 257/786

(56) References Cited

U.S. PATENT DOCUMENTS

| | | | |
|---|---|---|---|
| 5,847,466 A | * 12/1998 | Ito et al. | 257/750 |
| 6,100,573 A | * 8/2000 | Lu et al. | 257/508 |
| 6,300,688 B1 | * 10/2001 | Wong | 257/734 |
| 2001/0000928 A1 | * 5/2001 | Lee et al. | 257/786 |
| 2001/0010407 A1 | * 8/2001 | Ker et al. | 257/781 |

FOREIGN PATENT DOCUMENTS

JP    09-219451 A    *  8/1997    ......... H01L/21/768

* cited by examiner

Primary Examiner—Allan R. Wilson
(74) Attorney, Agent, or Firm—Powell Goldstein Frazer & Murphy LLP (57) ABSTRACT

A bonding pad structure of semiconductor device having improved bondability is disclosed. The bonding pad structure uses at least one level comprising conductive islands and conductive plugs used as fasteners to prevent the bonding pad layer from peeling and cracking during the bonding process.

10 Claims, 8 Drawing Sheets

BONDING PAD STRUCTURE OF SEMICONDUCTOR DEVICE HAVING IMPROVED BONDABILITY

BACKGROUND OF THE INVENTION

1. Field of the Invention

The present invention relates to a bonding pad structure of a semiconductor device, and more particularly to a bonding pad structure of a semiconductor device having improved bondability.

2. Description of the Related Art

As electrical components are made smaller, various strategies have been adopted to reduce the amount of space devoted to connections between the chip containing the integrated circuit devices and the printed circuit board on which the chips are mounted. Electrical connections between integrated circuits on a chip and the printed circuit board are made through bonding pads typically provided at the periphery of the chip. Conventional bonding pad structures may include a bonding metal layer and a barrier metal layer deposited over an underlying dielectric layer such as a silicon oxide layer. The bonding metal layer is in electrical contact with one or more semiconductor devices in the chip. The barrier metal layer on the underlying dielectric layer helps adhere the bonding metal layer, typically aluminum, to the underlying dielectric layer. The bonding metal layers of the conventional bonding pad structures have been observed to delaminate or have layers that separate from one another in response to external forces like those applied in wire bonding processes of the type typically used attaching wires to the bonding pads.

Connections between the bonding pads of a chip and the leads printed on the circuit board have conventionally been provided through the lead frame used as part of lead frame packaging methods. In such lead frame packaging methods, the chip is mounted to a frame which incorporates an array of electrical leads, with thin bonding wires connecting the bonding pads to the electrical leads on the lead frame. The entire chip and lead frame assembly is encapsulated in plastic and then mounted on the printed circuit board through the leads extending from the package. Another packaging method which is called the chip-on-board method, and the semiconductor chip is mounted directly to the printed circuit board, have significant space and weight advantages over conventional lead frame packaging methods. Electrical connections between the bonding pads of the chip and the circuit board on which the chip is mounted are typically provided by wire bonding thin wires between the chips bonding pads and the leads printed on the board. The wire bonds may be formed using a variety of techniques including ultrasonic bonding and thermocompression bonding. Ultrasonic bonding uses ultrasonic waves or vibration to attach the wire to the bonding pad. Thermocompression bonding uses a combination of elevated temperature and compressive force to attach the wire to the bonding pad. Both of these bonding techniques impart mechanical and/or thermal energy directly to the bonding pad area and so can damage the bonding pad and the chip. Proper control of the process variables used in these techniques, such as bonding temperature, bonding load and ultrasonic vibration magnitude is important to the formation of high quality bonds and to the protection of the underlying chip.

It has been observed that wire bonding may cause the bonding pad to lift off or peel back (delaminate) from one or more of the underlying layers, weakening the bonding pad structure and damaging other portions of the chip's wiring.

Figure 1:
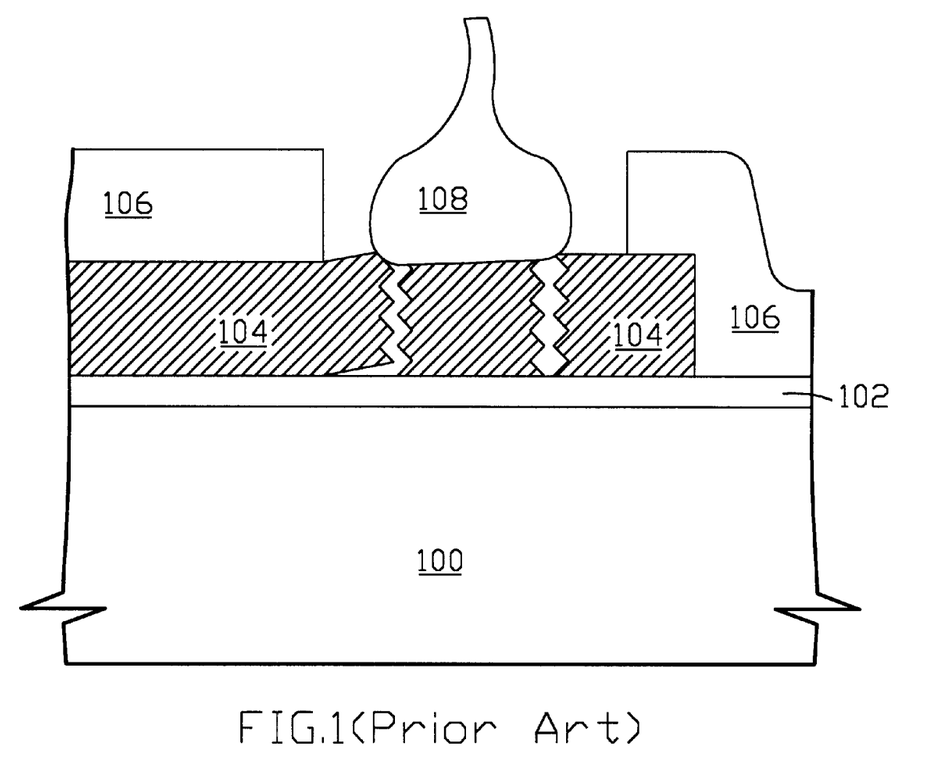
FIG. 1 shows results of peeling and cracking of a bonding pad of a conventional bonding pad structure amid a wire bonding process.

As shown in FIG. 1, a bonding pad 104 of a conventional bonding pad structure peels or cracks amid a wire bonding process, wherein a substrate 100, a conductive layer 102 which is used as a barrier/glue layer, a passivation layer 106 and a bonding wire 108 are also shown. Such peel back reduces or prevents electrical contact between the bonding pad and the integrated circuit devices on the chip, which decreases the reliability and reduces the life of the chip. The stresses applied during wire bonding processes are much harder to control for chip-on-board assembly methods than for more conventional lead frame packaging technique for a number of reasons. For example, there are far greater variations in the thickness of printed circuit boards than there are in lead frames. Thus, for chip-on-board methods, there are greater variations in the position of the bonding pad with respect to the wire bonding equipment and so an increased likelihood that an appropriate level of force will be applied during wire bonding.

It is desirable to form bonding pad structures exhibiting improved bondability and durability with better adhesion to underlying layers, so that the bonding pad structures are more compatible with conventional packaging techniques.

SUMMARY OF THE INVENTION

It is therefore an object of the invention to provide a bonding pad structure having improved bondability and durability.

It is another object of this invention to provide a bonding pad structure which can prevent the bonding pad layer from peeling and cracking amid the wire bonding process.

It is a further object of this invention to provide a bonding pad structure to improve the yield ratio and the quality of electrical connections between integrated circuits on a chip and the printed circuit board.

To achieve these objects, and in accordance with the purpose of the invention, the invention use a bonding pad structure having improved bondability. In one embodiment of this invention, the bonding pad structure comprises a substrate, a first conductive layer on the substrate comprising a plurality of conductive islands, a plurality of conductive plugs on each conductive island, a dielectric layer on the substrate and between the conductive plugs and the conductive islands, and a second conductive layer over the dielectric layer and the conductive plugs.

In another embodiment of this invention, the bonding pad structure has a configuration similar to the one set forth. This bonding pad structure comprises a substrate, a first conductive layer on the substrate comprising a plurality of first conductive islands, a plurality of first conductive plugs on each the first conductive island, a first dielectric layer on the substrate and between the first conductive plugs and the first conductive islands, a second conductive layer over the first dielectric layer and the first conductive plugs comprising a plurality of second conductive islands wherein each the second conductive island is connected to the adjacent first conductive islands by the first conductive plugs, a plurality of second conductive plugs on each the second conductive island, a second dielectric layer on the first dielectric layer and between the second conductive plugs and the second conductive islands, and a third conductive layer over the second dielectric layer and the second conductive plugs. The second conductive island mentioned above can also be arbitrarily connected to the first conductive islands by the first conductive plugs.

In still another embodiment of this invention, the bonding pad structure can be formed by using a dual damascene process, that is, the conductive islands and the conductive plugs are formed together, but other methods should not be excluded. A multilevel dual damascene structure is used to fasten a bonding pad layer to prevent the bonding pad layer from peeling or cracking.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 2A:
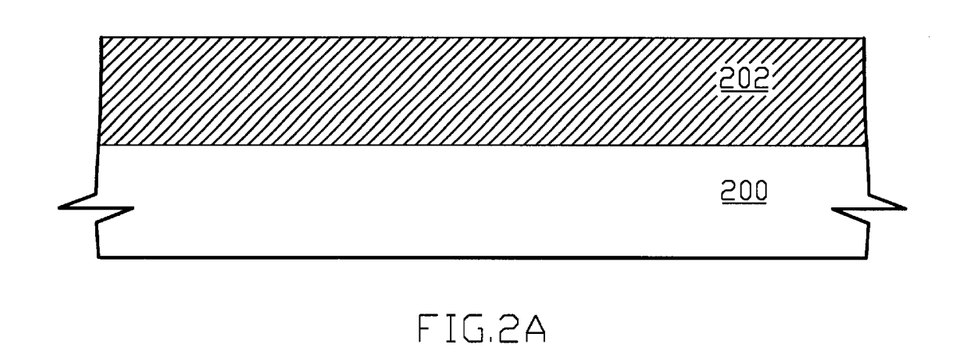
FIG. 2A shows a substrate having a conductive layer thereon.

Referring to FIG. 2A, a substrate 200 having a conductive layer 202 thereon is shown. The substrate 200 can be an intermetal dielectric (IMD) layer of a typical multilevel interconnect structure, and the conductive layer 202, which can be either a copper layer or an aluminum layer, can be a part of an interconnect layer or a dummy conductive layer.

The substrate 200 and the conductive layer 202 can be formed by using conventional methods of the backend process of modern integrated circuits. The thickness of the conductive layer 202 is about 5000 angstroms to about 10000 angstroms.

Figure 2B:
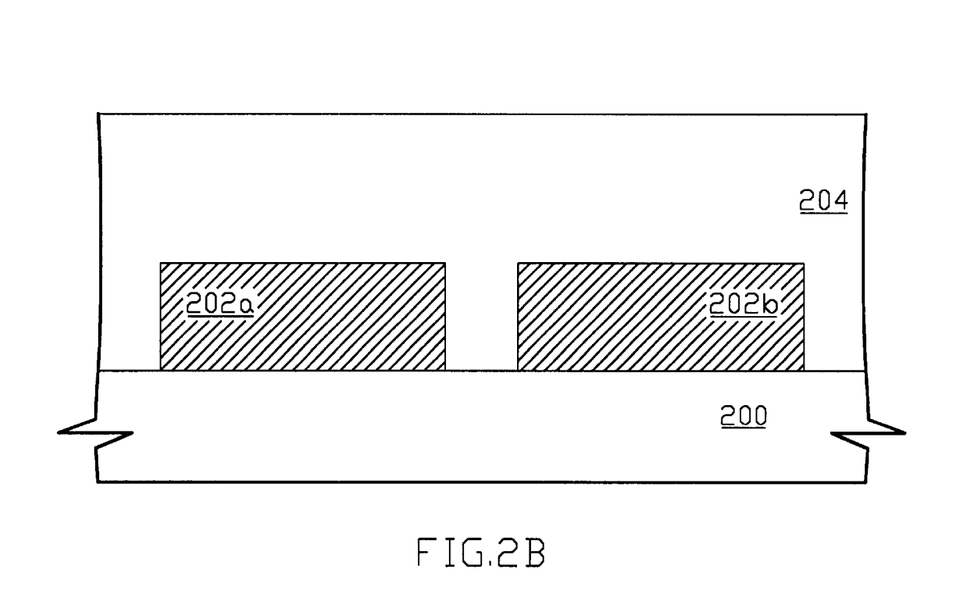
FIG. 2B shows results of etching the conductive layer to form conductive islands, and forming a dielectric layer over the substrate.
Figure 2C:
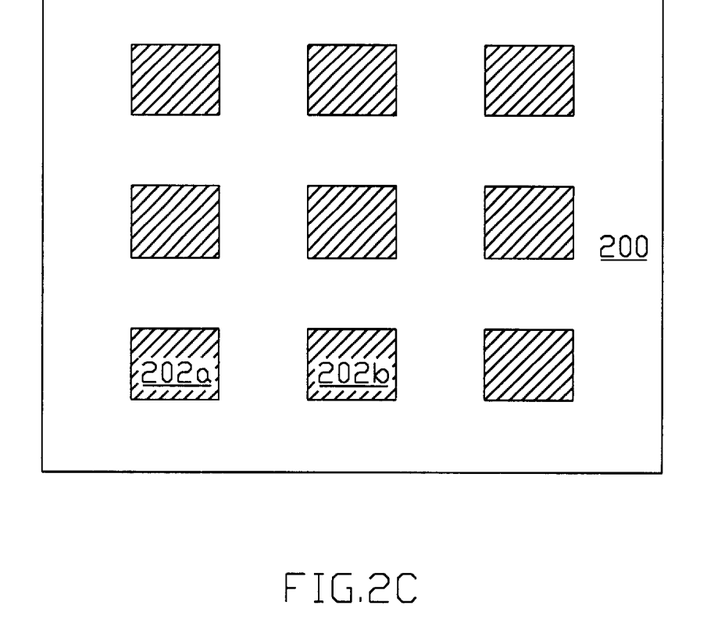
FIG. 2C shows the top view of the structure shown in FIG. 2B.
Figure 2D:
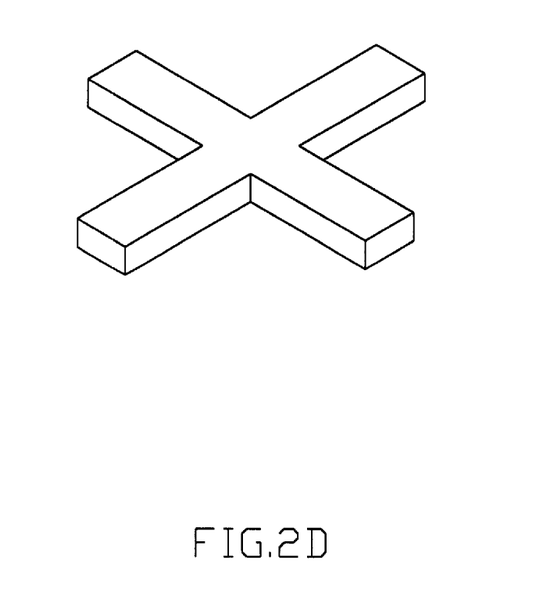
FIG. 2D shows shape examples of the conductive islands.
Figure 2E:
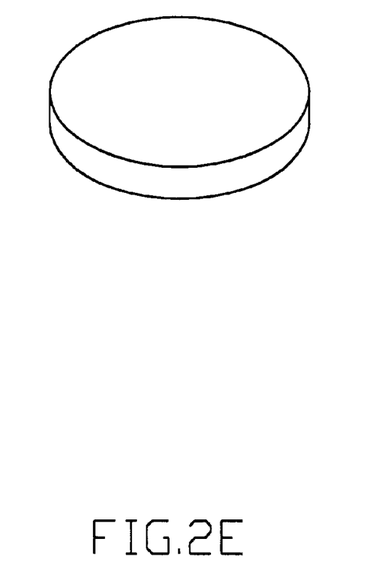
FIG. 2E shows shape examples of the conductive islands.
Figure 2F:
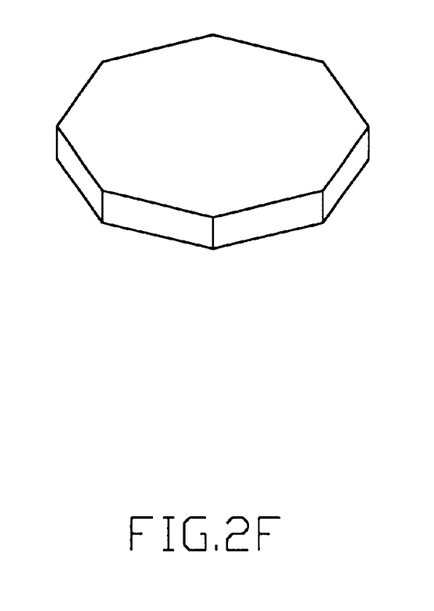
FIG. 2F shows shape examples of the conductive islands.

Referring to FIG. 2B, the conductive layer 202 is etched to expose the substrate 200 and form conductive islands 202a and 202b, and a dielectric layer 204 is formed over the substrate 200. The conductive islands 202a and 202b can be formed via conventional photolithography and etching methods in the art. FIG. 2C shows the top view of the structure shown in FIG. 2B wherein the dielectric layer 204 is omitted for simplicity. Moreover, the shape of the conductive islands 202a and 202b is not necessary a cuboid or a cube. In stead, as shown in FIG. 2D, FIG. 2E and FIG. 2F, it can be a cross, a disk, an octagon and any other geometric shape. It is also noted that the array of the conductive islands shown in FIG. 2C is just an example, and the conductive islands can array in any way. The conductive islands 202a and 202b are preferably formed by anisotropically etching the conductive layer 202, but an isotropic etching process should not be excluded. The etching process is preferably a reactive ion etching (RIE) process. The conductive layer 202 is preferably an aluminum layer or a copper layer, but other conductive layer should be included. The dielectric layer 204 can be a silicon dioxide layer or a borophosphosilicate glass (BPSG) layer formed via conventional methods used to form an IMD layer.

Figure 2G:
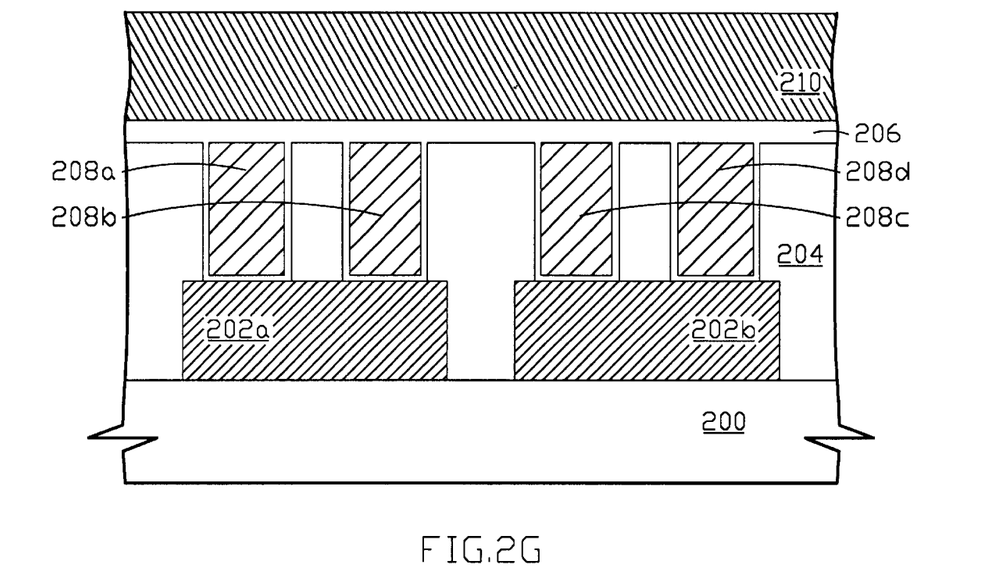
FIG. 2G shows a structure of a level of this invention and a conductive layer thereon.

Referring to FIG. 2G, conductive plugs 208a–208d are formed in the dielectric layer 204 and on the conductive islands 202a and 202b, and a barrier layer 206 is conformally formed over the dielectric layer 204, and it encapsulates the conductive plug 208a–208d. A conductive layer 210 is also shown. The formation of the conductive plugs 208a–208d comprises the step of transferring hole patterns into the dielectric layer 204 to expose the conductive islands 202a and 202b respectively, forming a conductive layer which can be a titanium layer or a tantalum layer over the holes, filling the holes with a conductive material to form the conductive plug 208a–208d, and forming the conductive layer over the dielectric layer 204 and the conductive plug 208a–208d again. The conductive material can be tungsten, copper and aluminum. The holes are preferably formed by a dry etching process and more particularly a RIE process. The conductive plugs 208a and 208b can be formed by using conventional processes used to form conventional contact plugs and via plugs. The barrier layer 206, which can be either a tantalum/tantalum nitride (Ta/TaN) layer or a titanium/titanium nitride (Ti/TiN) layer having a thickness between about 200 to about 400 angstroms, is formed via annealing the conductive layer in a nitrogen containing ambient to form a TaN layer or a TiN layer. It is noted that the number and the array of the conductive plugs set forth are just examples, in stead, the number can be one or more than two and the conductive plugs can array arbitrarily.

Figure 2H:
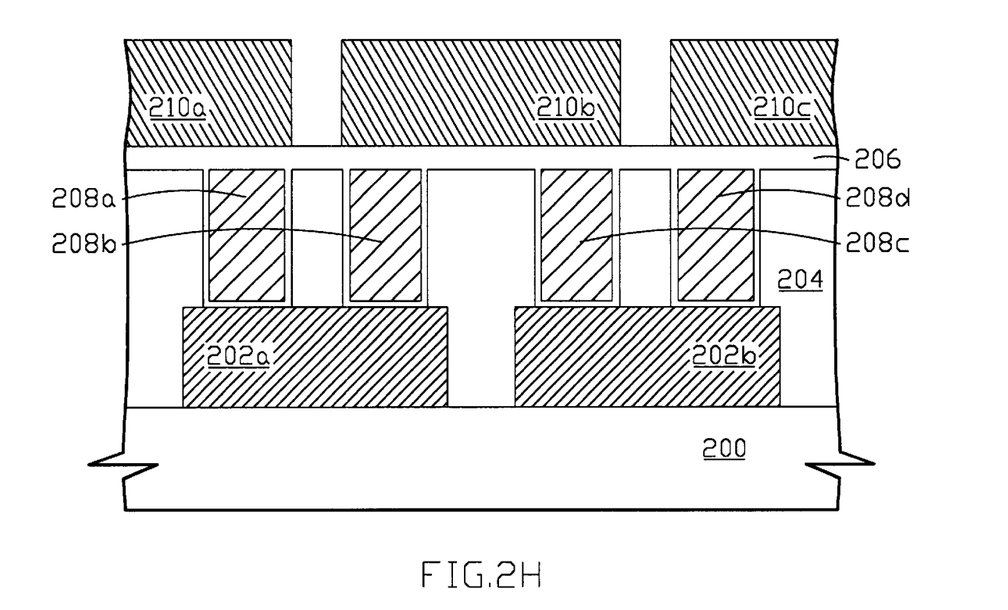
FIG. 2H shows a result of etching the conductive layer shown in FIG. 2G to form conductive islands on the level shown in FIG. 2G.
Figure 2I:
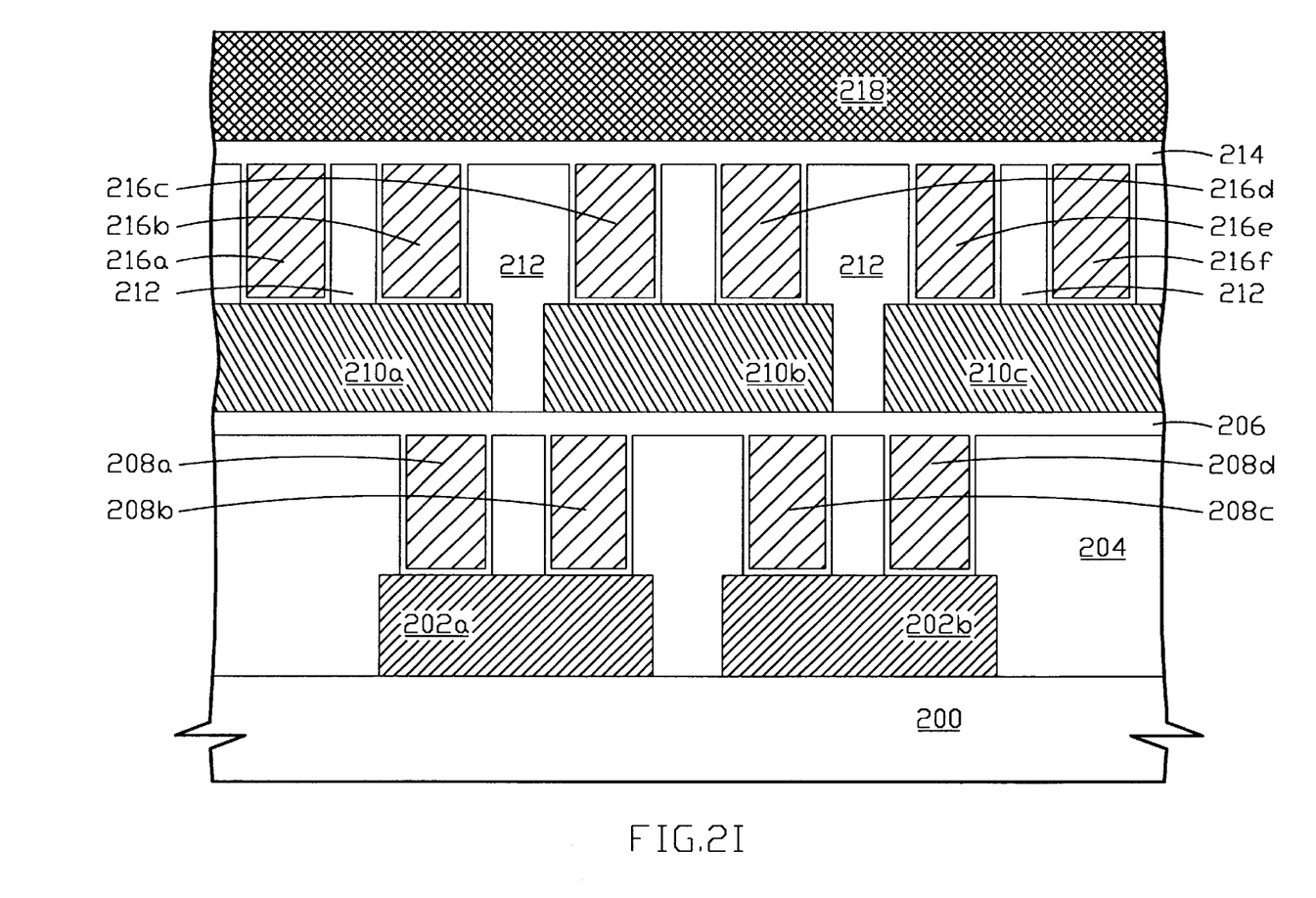
FIG. 2I shows a structure of two levels of this invention and a conductive layer thereon.

Referring now to FIG. 2H, conductive islands 210a–210c are formed on the barrier layer 206 by the same method used to form the conductive islands 202a and 202b. The shape of the conductive island 210a–210c, similar to the conductive islands 202a and 202b, is not necessary a cuboid or a cube, and it can also be a cross, a disk, an octagon as shown in FIG. 2D, FIG. 2E and FIG. 2F, and any other geometric shape. Moreover, a dielectric layer 212, a barrier layer 214, conductive plugs 216a–216f and a conductive layer 218 used as a bonding pad are shown in FIG. 2I. The conductive island 210a–210c can be aluminum or copper and the dielectric layer 212 can be a silicon dioxide layer or a borophosphosilicate glass (BPSG) layer formed via conventional methods. The barrier layer 214 and conductive plugs 216a–216f can be formed by the method used to form the barrier 206 and the conductive plugs 208a–208d. The conductive layer 218 can be formed by conventional methods used to form bonding pads. The conductive layer 218 can be an aluminum layer, a copper layer and an aluminum-copper alloy. It is noted that the number and the array of the conductive plugs set forth are just examples, in stead, the number can be one or more than two and the conductive plugs can array arbitrarily.

Figure 3:
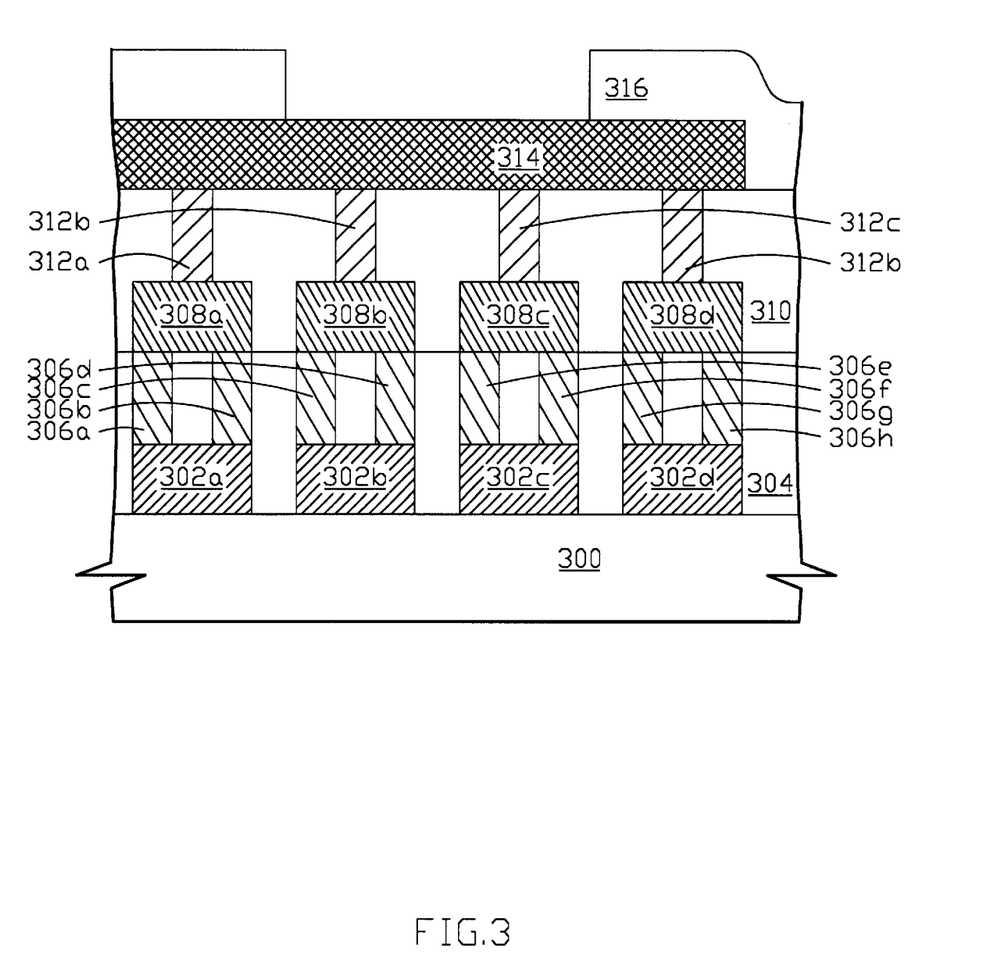
FIG. 3 shows another configuration of the bonding pad structure of this invention.

Referring now to FIG. 3, another bonding pad structure formed by using a method similar to the one mentioned above is shown. A bonding pad layer 314 is fastened to prevent the same from peeling amid the wire bonding process by conductive islands 308a–308d and conductive islands 302a–302d on two levels. The bonding pad layer 314 and the conductive islands 308a–308d are connected by conductive plugs 312a–312d, and the conductive islands 302a–302d and 308a–308d are connected by conductive plugs 306a–306h. A substrate 300, dielectric layers 304 and 310, and a passivation layer 316 are also shown. It is noted that barrier layers similar to the barrier layers 206 and 214 are omitted for simplicity in this figure. The bonding pad layer 314 is connected to a multilevel interconnect structure of an integrated circuit which is not shown, and the bonding pad structure has no effective electronic function of the device operation. In stead, the bonding pad structure is merely used to fasten and prevent the bonding pad layer 314 from peeling during the wire bonding process. The substrate 300 is similar to the substrate 200 and the dielectric layers 304 and 310 are also similar to the dielectric layers 204 and 212. The bonding pad layer 314 can be an aluminum layer, a copper layer and an aluminum-copper alloy, and it can be formed by conventional methods used to form conventional bonding pad layer. The passivation layer 316 can be a silicon dioxide layer or a silicon nitride layer formed by a conventional chemical vapor deposition process.

Figure 4:
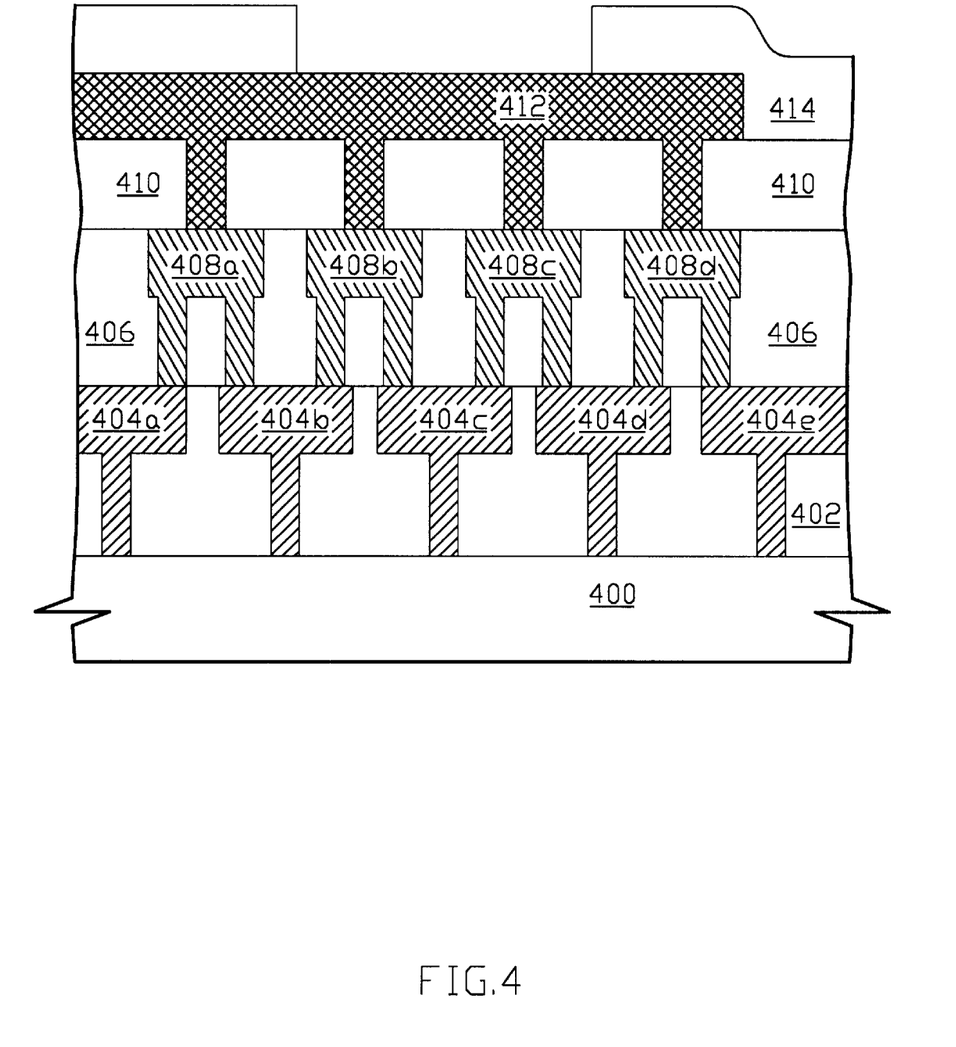
FIG. 4 shows still another configuration of the bonding pad structure of this invention.

Referring to FIG. 4, still another bonding pad structure formed by using a dual damascene process is shown. The conductive islands and the conductive plugs are formed together. A substrate 400, dielectric layers 402, 406 and 410, dual damascene structures 404a–404e and 408a–408d, a bonding pad layer 412, and a passivation layer 414 are shown in this figure. The dual damascene structures 404a–404e and 408a–408d are used to fasten the bonding pad layer 412 to prevent the bonding pad layer 412 from peeling or cracking. The dual damascene structures 404a–404e and 408a–408d can be arbitrarily connected, and the number and the array of the conductive plugs depend on the demand. The shapes of the conductive islands of the dual damascene structures 404a–404e and 408a–408d can be any geometrical shape, for example, a cross, a cuboid and a disk. The bonding pad layer 412 can also be formed by a dual damascene process or other conventional methods used to form bonding pad layers, and it is connected to a multilevel interconnect structure of an integrated circuit which is not shown, and the bonding pad structure has no effective electronic function of the device operation. The bonding pad layer 412 can be an aluminum layer, a copper layer and an aluminum-copper alloy. The dielectric layers 402, 406 and 410 can be a silicon dioxide layer or a borophosphosilicate glass (BPSG) layer formed via conventional methods used to form IMD layers. The dual damascene structures can be copper dual damascene structures or tungsten dual damascene structures. The passivation layer 414 can be a silicon dioxide layer or a silicon nitride layer formed by a conventional chemical vapor deposition process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A bonding pad structure of a semiconductor device, said bonding pad structure comprising:
   a substrate;
   a plurality of distributed conductive islands each having a shape of a solid disk on said substrate;
   a plurality of conductive plugs on each said conductive island;
   a dielectric layer on said substrate and between said conductive plugs and said conductive islands; and a bonding pad layer over said dielectric layer and said conductive plugs.

2. The bonding pad structure according to claim 1, wherein said substrate comprises an intermetal dielectric layer.

3. The bonding pad structure according to claim 1, wherein said conductive plugs comprise tungsten plugs.

4. The bonding pad structure according to claim 1, wherein said conductive plugs comprise copper plugs.

5. The bonding pad structure according to claim 1, wherein said conductive plugs comprise aluminum plugs.

6. The bonding pad structure according to claim 1, wherein said dielectric layer comprises a silicon dioxide layer.

7. The bonding pad structure according to claim 1, wherein said dielectric layer comprises a borophosphosilicate glass □BPSG□layer.

8. A bonding pad structure of a semiconductor device, said bonding pad structure comprising:
   a substrate;
   at least one level over said substrate, said level comprising
      a plurality of distributed conductive plugs;
      a plurality of conductive islands having a shape of a solid circular disk,
   wherein each said conductive island is on said conductive plugs, and each said conductive island together with said conductive plugs beneath are through said level;
   a dielectric layer between said conductive islands and said conductive plugs;
   a top dielectric layer over said level;
   a plurality of top conductive plugs through said top dielectric layer; and a
   bonding pad layer over said top dielectric layer, wherein said bonding pad layer is connected to each said conductive island of said level by said top conductive plugs.

9. The bonding pad structure according to claim 8, wherein each said conductive island and said conductive plugs comprise a dual damascene structure.

10. The bonding pad structure according to claim 8, wherein said dual damascene structure comprises a copper dual damascene structure.

* * * * *